United States Patent
Srivastava et al.

(10) Patent No.: US 8,538,362 B2
(45) Date of Patent: Sep. 17, 2013

(54) SQUELCH DETECTION CIRCUIT AND METHOD

(75) Inventors: Ankit Srivastava, San Diego, CA (US); Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 279 days.

(21) Appl. No.: 12/837,902

(22) Filed: Jul. 16, 2010

(65) Prior Publication Data

US 2012/0015617 A1    Jan. 19, 2012

(51) Int. Cl.
*H04B 1/10* (2006.01)

(52) U.S. Cl.
CPC .................. *H04B 1/1027* (2013.01)
USPC ......................... 455/218; 455/222

(58) Field of Classification Search
CPC .................................... H04B 1/1027
USPC ............... 455/212, 214, 218, 219, 220, 222, 455/225, 232.2, 254, 296, 115.1, 115.2; 375/316; 327/58, 62
See application file for complete search history.

(56) References Cited

U.S. PATENT DOCUMENTS

| | | | | |
|---|---|---|---|---|
| 3,873,926 A | * | 3/1975 | Wright | 455/225 |
| 5,436,934 A | | 7/1995 | Co | |
| 5,697,079 A | * | 12/1997 | Spivey | 455/212 |
| 5,717,720 A | * | 2/1998 | Jackson et al. | 375/316 |
| 5,828,240 A | * | 10/1998 | Smith | 327/62 |
| 6,653,892 B2 | | 11/2003 | Park | |
| 6,907,202 B1 | | 6/2005 | Ide et al. | |
| 7,120,408 B2 | | 10/2006 | Wood | |
| 7,831,223 B2 | * | 11/2010 | Kawashima | 455/115.2 |
| 2003/0179016 A1 | | 9/2003 | Fujiwara | |
| 2007/0069768 A1 | | 3/2007 | Hatooka et al. | |
| 2008/0197886 A1 | | 8/2008 | Kawakami | |
| 2009/0206806 A1 | | 8/2009 | Kamatani | |

OTHER PUBLICATIONS

International Search Report and Written Opinion—PCT/US2011/044091—ISA/EPO—Apr. 4, 2012.

* cited by examiner

*Primary Examiner* — Thanh Le
(74) *Attorney, Agent, or Firm* — Sam Talpalatsky; Nicholas J. Pauley; Joseph Agusta

(57) ABSTRACT

A squelch detection circuit and method involves a first comparator coupled to a complimentary input signal pair and having a first polarity output. A second comparator coupled to the complimentary input signal pair has a second polarity output. An offset associated with complimentary input signal pair establishes a positive squelch threshold and a negative squelch threshold. A calibration unit coupled to the first comparator and the second comparator generates a digital output including threshold settings and calibration settings to the first comparator and to the second comparator. The digital output can be associated with establishing the offset and with calibrating the positive squelch threshold and the negative squelch threshold.

46 Claims, 11 Drawing Sheets

SQUELCH DETECTION CIRCUIT AND METHOD

FIELD OF DISCLOSURE

The present disclosure is related to communications and more specifically, to a squelch detection circuit having an inexpensive current source to generate offset and having programmable threshold and calibration settings and associated method.

BACKGROUND

Squelch detectors are commonly used in communication links, such as high speed serial links, to provide an indication of when data signals are present on a link as distinguished from noise signals and the like. When the data signal is not present, the receiver can be momentarily turned off, thus limiting power consumption. Over time, such off-intervals can result in increased battery life for hand held receivers and other benefits.

In order to operate effectively, squelch detectors are typically configured with a large gain value and a large bandwidth so as to ensure maximum detection probability. The bandwidth of the squelch detector is generally wider than the input bandwidth of the receiver. Such requirements can reduce the efficiency of the overall receiver since power gains achieved by receiver shut-off during intervals where no signal is detected are lost by the need for additional power to support wider bandwidth can gain requirements of the detection stage.

A typical signal configuration in a modern high speed data link involves differential signal pairs that are of opposite polarity and transition to different and opposite levels during data transitions. Such operation is known in the art as differential signaling and is advantageous, inter alia, because of the inherent noise rejecting properties, tolerance to DC offset and the like. A receiver using differential signaling can experience enhanced common mode noise rejection, although such rejection can be due to the balanced nature of the typical transmission line. The signals on each line are compared only to each other and thus external influences of factors such as DC offset can be minimized.

In order to create a detection envelope, squelch detectors introduce offset as will be described in greater detail hereinafter in connection with, for example, the conventional circuit shown in FIG. 1. By using, for example, a replica circuit, a current mismatch can be introduced on the two branches of a differential amplifier. Signals that fall outside the detection envelope established by the offset are considered data signals while signal energy within the offset is considered noise.

Disadvantages can arise in conventional squelch detection circuits in that that linearity constraint can be exceeded and circuit sensitivities to current and replica matching can arise. Further, the common mode of the replica circuit is fixed, while that of the actual amplifier varies, for example in accordance with universal serial bus (USB) standard version 2.0. Accordingly, a systematic mismatch and hence additional and often non-linear offset can be introduced in a scheme that uses a replica circuit. Consequently, errors can arise due to mismatch and also due to any offset inherent in the replica circuit. Such errors are difficult to compensate for since they may vary across different signal levels and also across different fabrication processes and scales.

SUMMARY

Exemplary embodiments are directed to circuits and methods for calibration and squelch detection threshold setting in a squelch detection circuit. Accordingly, a first comparator having a first polarity output can be coupled to a complimentary input signal pair. A second comparator having a second polarity output can be coupled to the complimentary input signal pair. An offset associated with, for example, the difference between the input signal pair, and with the first polarity and the second polarity output can be used to establish a positive squelch threshold and a negative squelch threshold. A calibration unit can be coupled to the first comparator and the second comparator. The calibration circuit generates a digital output including threshold settings and calibration settings to the first comparator and to the second comparator. The digital output associated with establishing the offset and the positive squelch threshold and the negative squelch threshold. The squelch detection circuit can further include a logic circuit coupled to the first comparator and the second comparator. The logic circuit can have inputs for the first polarity output and the second polarity output and an output for a squelch signal.

In an embodiment, a first comparator means, which means can be constituted as the first comparator circuit, can provide a first polarity output when an offset associated with a complimentary input signal pair exceeds a first squelch threshold value. A second comparator means can be for providing a second polarity output when the offset associated with the complimentary input signal pair exceeds a second threshold value. A calibration means can be coupled to the first comparator means and the second comparator means and can be for generating a digital output including threshold settings and calibration settings to the first comparator and to the second comparator, the digital output for establishing the offset, the positive squelch threshold and the negative squelch threshold.

In accordance with an embodiment, a calibration circuit for a squelch detector can include a programmable resistor network coupled to a comparator circuit in the squelch detector. The programmable resistor network includes a plurality of resistors. A first portion of the plurality of resistors is for establishing a squelch detection threshold setting and a second portion of the plurality of resistors is for establishing a calibration setting for calibrating a mismatch between a first input and a second input of the comparator circuit. A switching network can be coupled to the programmable resistor network, and can include a plurality of switching elements coupled to the plurality of resistors. First ones of the plurality of switching elements can be coupled to the first portion and second ones of the plurality of switching elements coupled to the second portion of the resistor network. Programming signals can be coupled to the switching network for selecting ones of the plurality of resistors through corresponding ones of the switching elements to establish the squelch detection threshold setting and the calibration setting for the comparator circuit.

In accordance with an embodiment, a method for calibrating a squelch detector circuit can be provided. The method can include exemplary procedures such as setting an internal offset in a comparator stage of the squelch detector circuit, introducing an external offset to the comparator stage, resetting a plurality of programming bits input to the comparator stage; and incrementing the plurality of programming bits until a transition in an output of the comparator stage occurs. The transition can represent a squelch detection threshold level associated with a difference between the internal offset and the external offset.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects of the embodiments are disclosed in the following description of and related drawings directed to specific embodiments. Alternate embodiments may be devised without departing from the scope of the invention. Additionally, well-known elements of the embodiments will not be described in detail or will be omitted so as not to obscure the relevant details of the embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
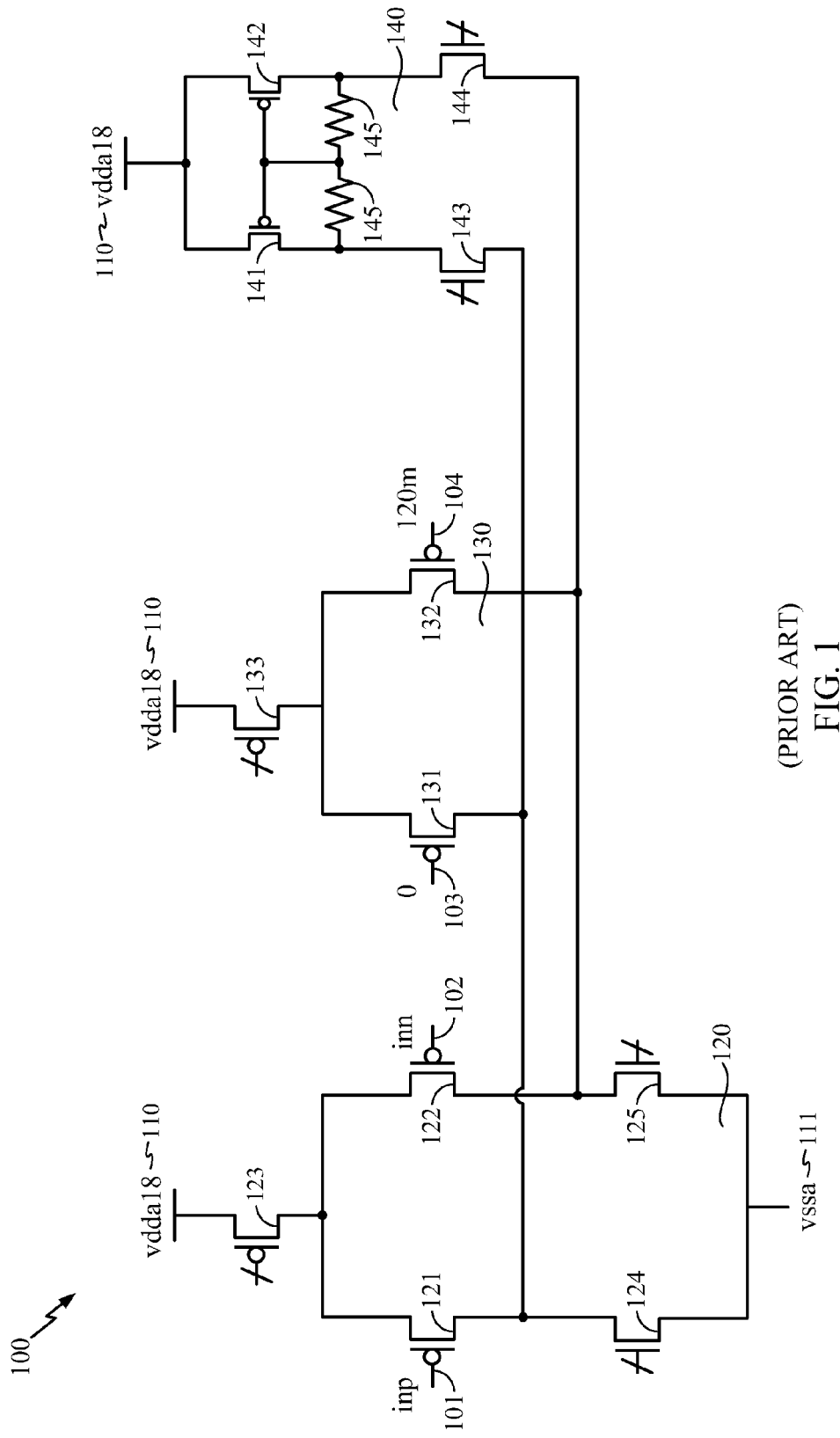
FIG. 1 is a schematic circuit diagram illustrating a prior art offset generating circuit.

With reference to FIG. 1, a conventional squelch detection circuit 100 is show for performing squelch detection in, for example, a receiver circuit. A positive version inp 101 of, for example, a complimentary differential input signal pair and a negative version inn 102 of the input signal pair are inputted into elements 121 and 122 of input circuit 120. In the prior art, a replica circuit 130 can be placed into the circuit to introduce a mismatch between the circuit branches. It will be noted that elements 131 and 132 are coupled to a 0 reference and a threshold reference such that the common mode of the circuit becomes fixed, while the common mode of the input circuit 120 varies based on the input signal excursions. Element 133 is coupled to vdda18 110. The input circuit 120 is situated between vdda18 110 and vssa 111 and has additional elements 123, 124 and 125 forming a folded cascode differential amplifier configuration. Circuit portion 140 provides gain and includes elements 141, 142, 143 and resistors 145. The loads of the differential pair are two current sources formed by transistors 141 and 142. The resistors 145 are used to sense the output common mode level and apply it to the gate of current sources 141 and 142. It should be noted that the resistors 145 are not related to establishing offset in connection with a squelch circuit as discussed and described herein. Also, it will be understood that the loads presented here are for illustrative purposes and can represent any general load.

Figure 2A:
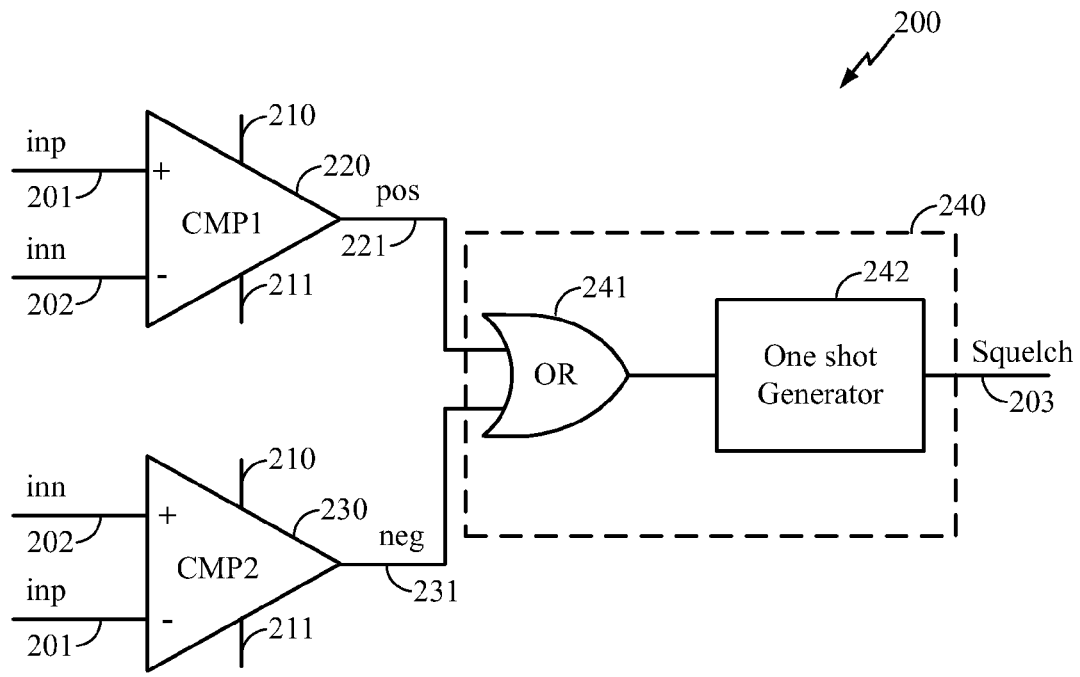
FIG. 2A is a block diagram illustrating an exemplary squelch detector.

A high speed communication circuit, such as a USB 2.0 circuit 200, is shown in FIG. 2A and includes a comparator CMP1 220, comparator CMP 2 230 and logic circuit 240. A complimentary differential signal including a positive input Inp 201 and a negative input Inn 202 can be input to CMP 1 220 and CMP 2 230 respectively in opposite relation, where, for CMP 1 220, Inp 201 is coupled to the non-inverting terminal and Inn 202 is coupled to the inverting terminal thereof. For CMP 2 230, Inn 202 is coupled to the non-inverting terminal and Inp 201 is coupled to the inverting terminal. Input signals can be relatively small such as between +/−10-20 mV. CMP 1 220 and CMP 2 230 can be coupled between a voltage vdda 210 and reference voltage vssa 211 and can generate output signals 221 and 231 respectively. The outputs 221 and 231 are coupled to a logic element 241 of logic circuit 240, shown as an OR element. The output of the OR element is coupled to a one-shot circuit 242, which generates a squelch signal 203. It will be appreciated that the squelch signal can indicate the presence or absence of a squelch condition, by way of an active high or active low level on the output thereof.

Figure 2B:
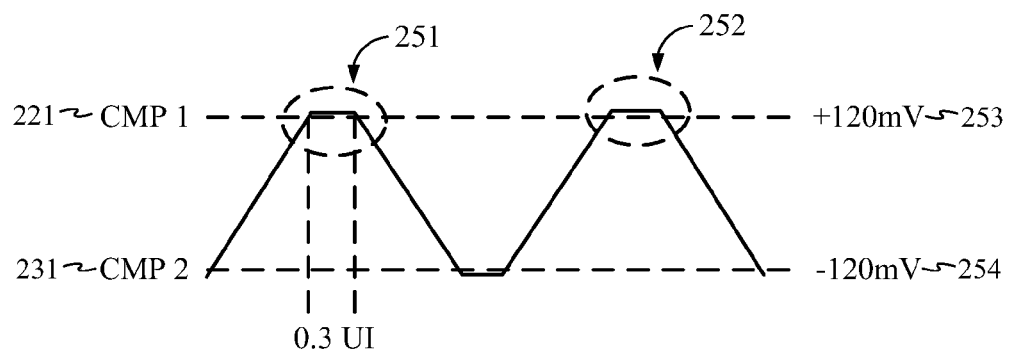
FIG. 2B is a signal diagram illustrating exemplary threshold crossing.

As illustrated in FIG. 2B, it will be appreciated that in accordance with the positive and negative supply voltage levels 210 and 211 that are applied to the comparators, and, for example, in accordance with signal input levels, the outputs of CMP 1 220 and CMP 2 230 can each swing, for example, from the positive output voltage limit or "rail" to the negative rail. It should first be noted that for signals with slow rise/fall times the input levels to the comparators CMP 1 220 and CMP 2 can be small, in the order of 10-20 mV, and thus require amplification. FIG. 2B shows the differential input to the comparator CMP1 and CMP2. It will be appreciated that the comparator CMP1 is configured to have an internal offset of 120 mV while comparator CMP2 is configured to have an internal offset of −120 mV. It should be noted that in accordance with USB2.0, the inter-symbol interference (ISI) eye-opening of the signal, in the worst case, can be just 0.3 unit interval (UI) where unit interval means one bit width. In accordance with the worst case signal, which is shown in FIG. 2B, the signal crosses the squelch detection thresholds for the comparator CMP1 and CMP2 +/−120 mV by a margin of only +/−10-20 mV respectively. In various exemplary embodiments, the squelch circuit should detect the above noted condition as a valid signal. It should also be noted that, due to process and other variations, the internal offsets of CMP1 and CMP2 can deviate from their ideal value of +/−120 mV. Thus, the two comparators need to be configured with a high gain in order to amplify a small 10-20 mV signal to full swing and a high bandwidth in order to detect a worst case signal crossing within a time margin of just 0.3UI.

The input offset described above can be advantageously established, in contrast to prior art approaches, using a simple current resistance (IR) value incorporated into a source follower input stage that is provided in connection with each of CMP 1 and CMP 2. The positive and negative supply voltages 210 and 212, which in the present example are vdda and ground, can be applied to a pair of source follower circuits, one for each input. In the present example, for the positive input Inp 201, element 321 and 322 can be coupled to input element 325 through offset element 350. It will be appreciated that in the present example offset element 350 is a resistive element. The offset element 350 can be coupled to, for example, a control line 351, which can be a digital bus or the like, for controlling the offset element 350. An output outp 301 can be taken from the A side of the offset element 350. For the negative input Inp 202, element 323 and 324 can be coupled to input element 326. An output outn 302 can be taken from the ungrounded terminal of element 326.

Figure 4A:
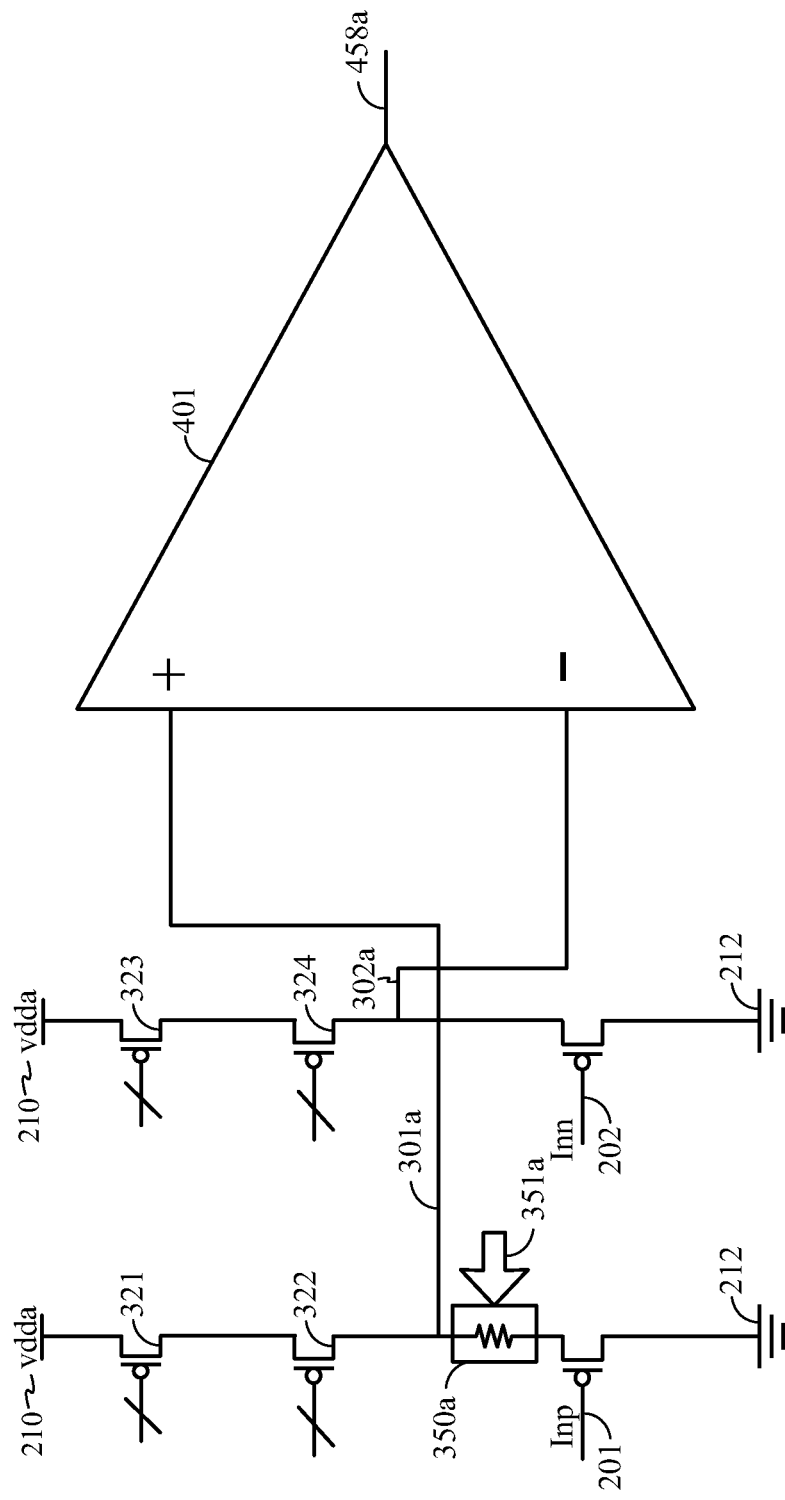
FIG. 4A is a schematic circuit diagram illustrating features of an exemplary squelch comparator circuit.
Figure 4B:
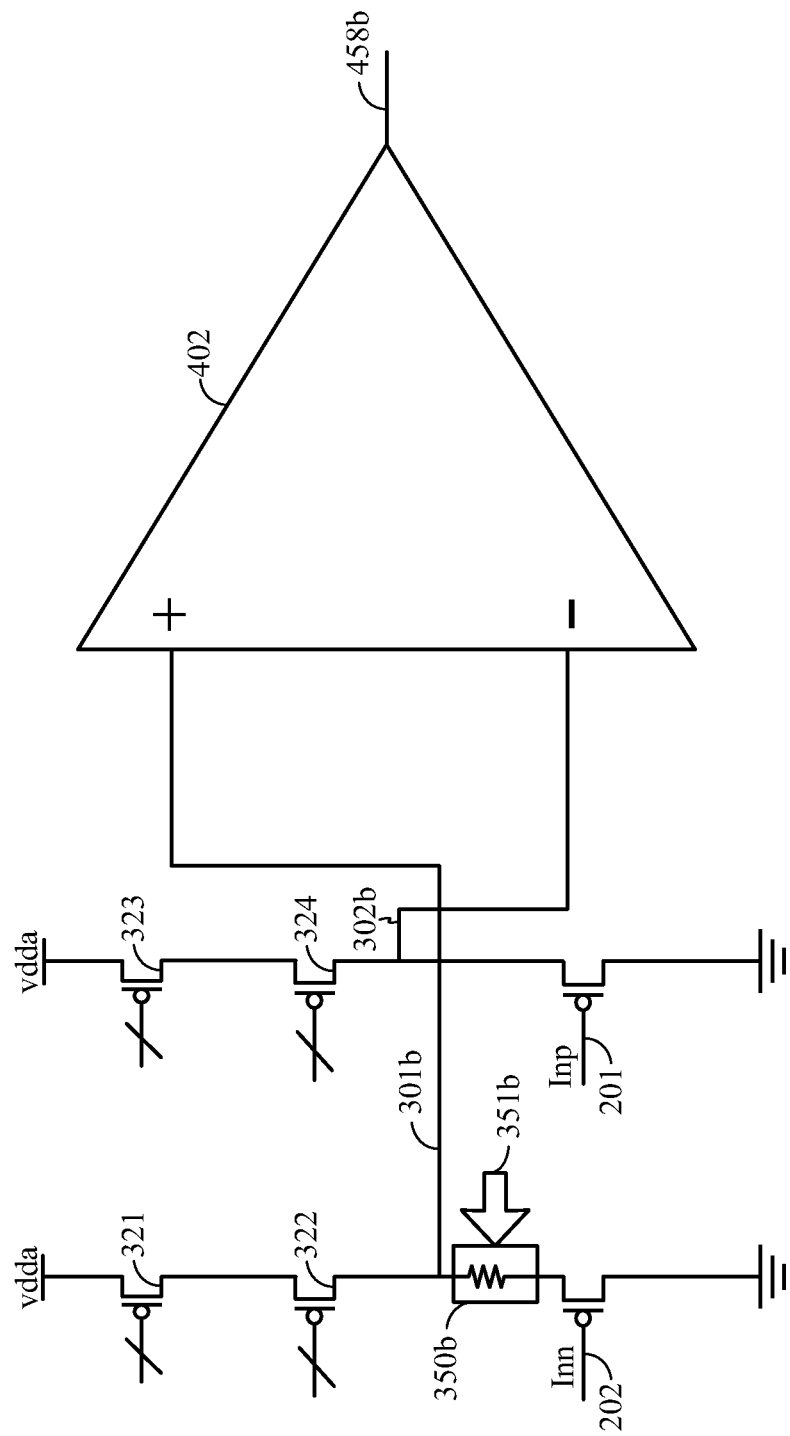
FIG. 4B is a schematic circuit diagram illustrating features of another exemplary squelch comparator circuit.

A version of the above described circuit can be used at the input of each of CMP 1 220 and CMP 2 230 as will be appreciated with reference to FIG. 4A and FIG. 4B. In FIG. 4A, an offset can be established using the offset element 350a in the positive signal input path to comparator 401, which can correspond to CMP 1 220, such that the positive input Inp 201 is coupled to the non-inverting terminal thereof and the offset is established with reference to the negative input signal Inn 202 which is coupled to the reference or inverting terminal. Outputs 301a and 302a can be input to comparator 401, which generates output 458a that can slew from rail to rail in accordance with the input signals. Similarly, with reference to FIG. 4B, an offset can be established using offset element 350b in the negative signal input path to comparator 402, which can correspond to CMP 2 230, such that the negative input Inn 202 is coupled to the non-inverting terminal thereof and the offset is established with reference to the positive input Inp 201, which is coupled to the reference or inverting terminal Outputs 301b and 302b can be input to comparator 402m which generates output 458b that can slew from rail to rail in opposite relation to comparator 401.

Figure 4C:
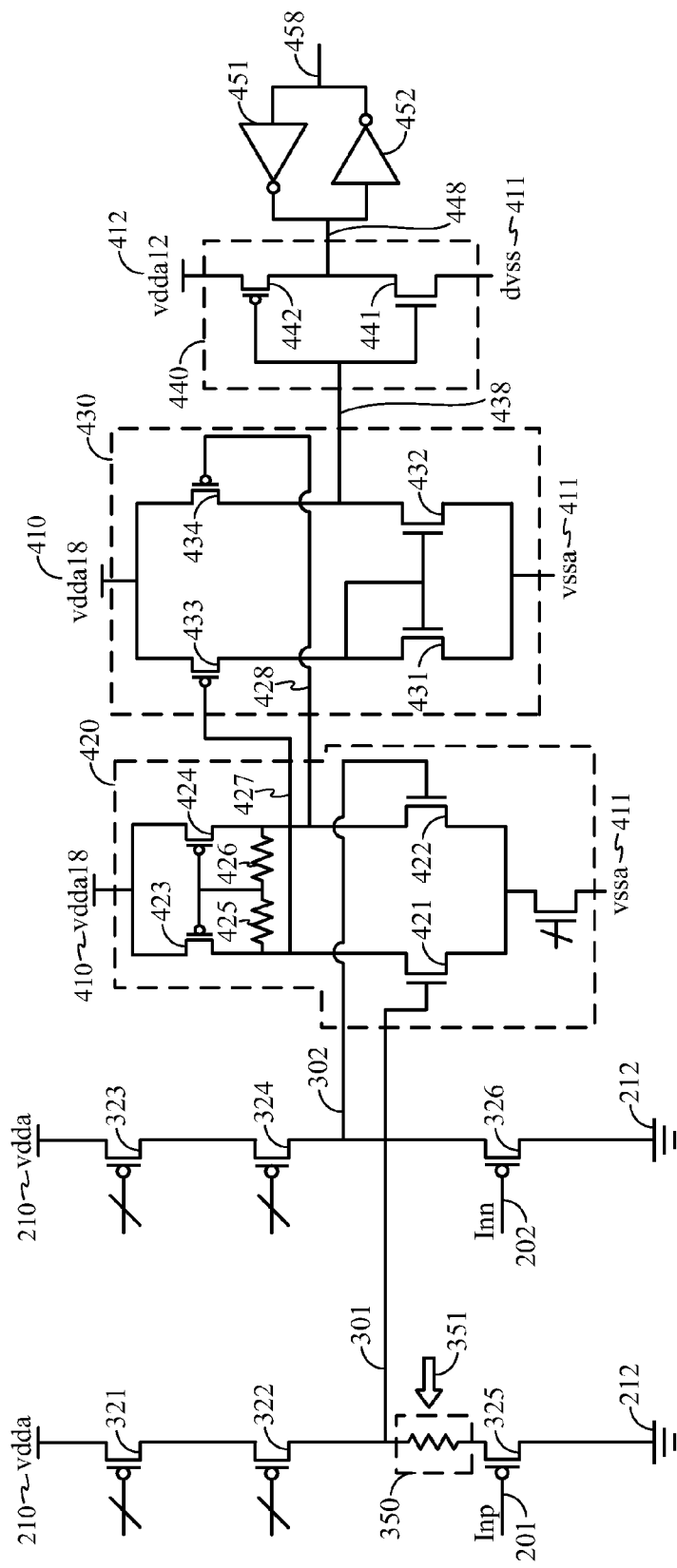
FIG. 4C is a schematic circuit diagram illustrating exemplary details of one of the squelch comparator circuits of FIG. 4A and FIG. 4B.

A more detailed view of an example of the comparator stages such as comparator 401 and 402 is illustrated in FIG. 4C. The outputs 301 and 302, generated from the source follower circuits can be input to initial amplification stage 420, in connection with the other sections, an analog output that can slew from, for example, vdda18 410 to vssa 411. Stage 420 can include elements 421-426 in a known configuration such as a differential amplifier configuration and generating outputs 427 and 428 which can be input to stage 430 which can be coupled between vdd18 412 and dvss 411 and includes element 431-434 configured as a slewing stage. The output of slewing stage 420 is coupled to a level-down shifter stage 440 implemented in the present example as inverter. A latching stage can be provided at the output to introduce an amount of hysteresis sufficient to prevent frequent toggling of comparator output if the input signal swing is close comparator offset.

Figure 3:
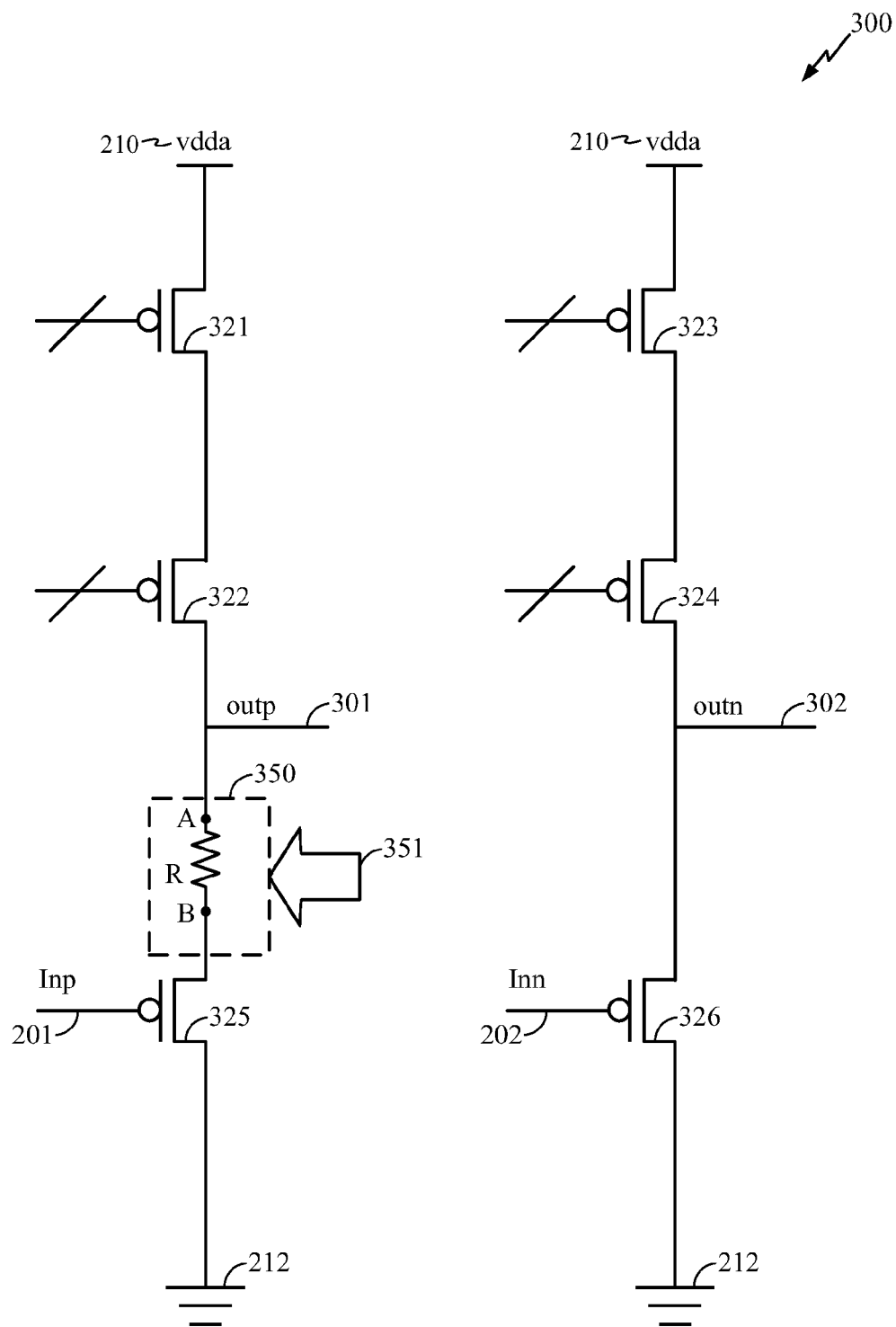
FIG. 3 is a schematic circuit diagram illustrating an exemplary squelch offset generating circuit.
Figure 5A:
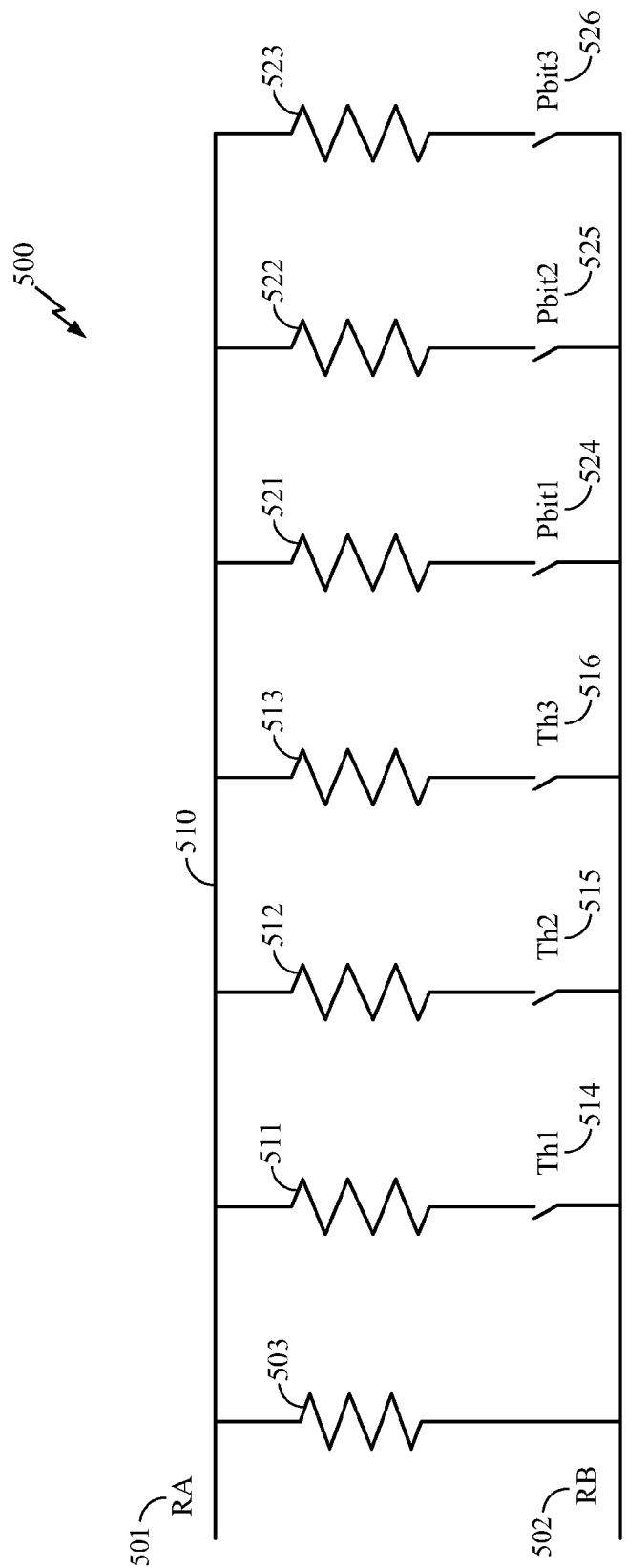
FIG. 5A is a diagram illustrating an exemplary threshold programming circuit.

To better understand the operation of the offset unit 350, a resistor network 500 is illustrated in FIG. 5A. It will be appreciated that RA 501 and RB 502 can correspond, for illustrative purposes, to nodes A and B of resistive element or resistor R in FIG. 3. An initial resistance value R 503 can be established based on a typical or minimum IR to establish a minimum or sub-minimum offset value. Portions of the resistor network, such as R 511-R 513 and R 521-R 523 can be included to address, for example, threshold setting as in the case of R 511-R 513 and calibration setting, as in the case of R 521-R 523. The portions of the resistor network can be controlled by way of switching elements Th1 514-Th3 516 and Pbit1 524-Pbit3 526, which can be used to switchably couple selected ones of the resistors in parallel with R 503 to calibrate residual offset and establish threshold levels and the like. It will be appreciated that the foregoing approach is vastly superior to the replica circuits and other circuits of the prior art in that it requires far fewer elements and uses less current and is more scalable across voltage and process variations.

Figure 5B:
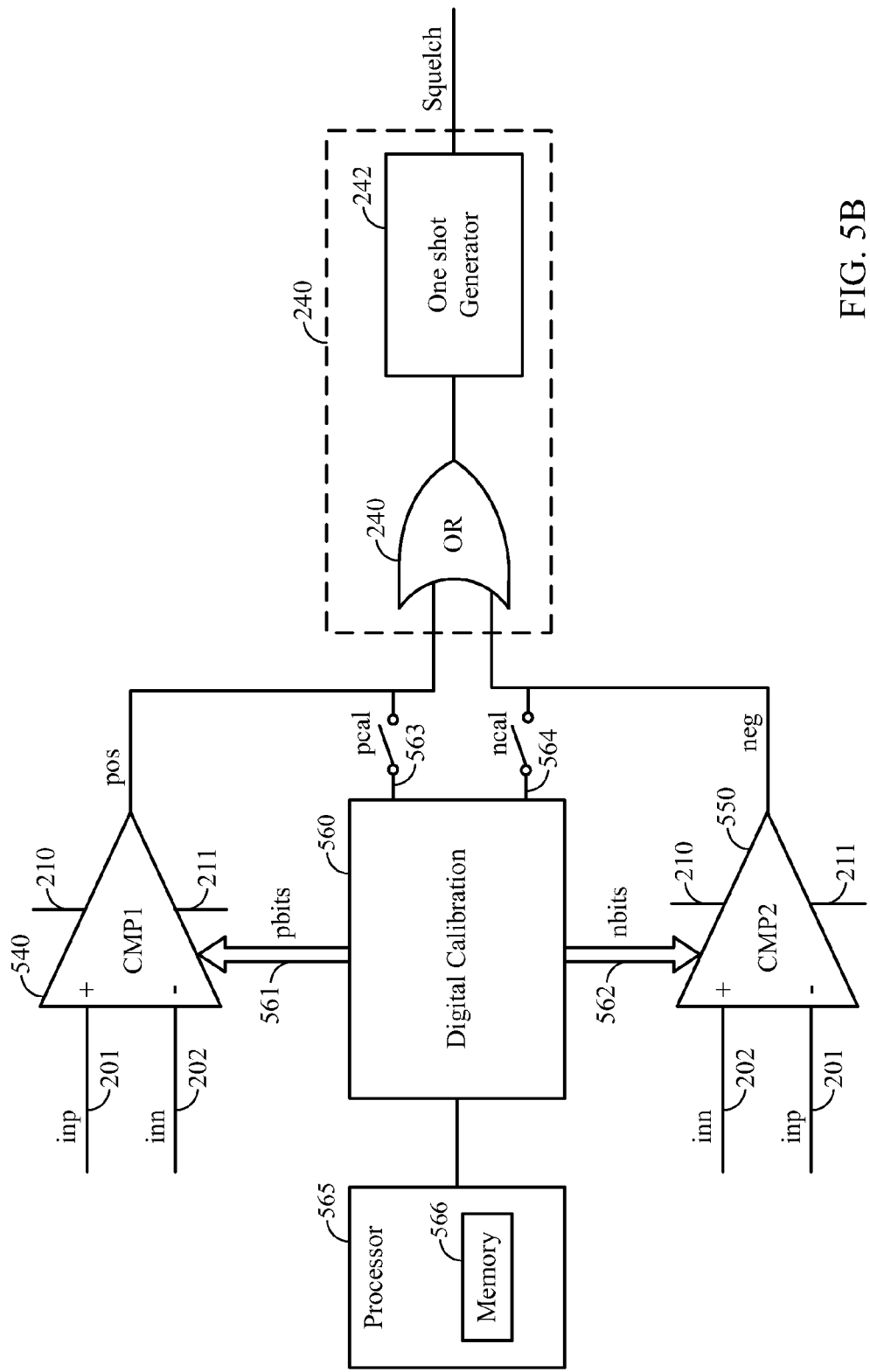
FIG. 5B is a block diagram illustrating an exemplary digital calibration circuit.

A block diagram illustrating how a calibration unit 560 can be used in an exemplary squelch circuit is shown in FIG. 5B. In the present embodiment, CMP 1 540, which can correspond to CMP 1 as described herein including any modifications described hereinafter, can be coupled to digital calibration unit 560 through pbits bus 561, which can be a serial or parallel data bus, or the like, and CMP 2 550, which can correspond to CMP 2 as described herein, including any modifications described hereinafter, can be coupled to digital calibration unit 560 through nbits bus 562. Digital calibration unit 560 can be a circuit, logic, or the like, or a combination of circuitry, as described in greater detail hereinafter. Alternatively, digital calibration unit 560 can be coupled to or can further include, or be under the control of a processor, controller, or the like such as processor 565 including a memory 566. Although shown for illustrative purposes as being external to digital calibration unit 560 and coupled thereto, it will be appreciated by one of ordinary skill that, in an embodiment, processor 565 and memory 566 can be incorporated into the circuitry of digital calibration unit 560.

Digital calibration unit 560 can be configured to monitor the output of CMP 1 540 and CMP 2 550 through, for example, configurable calibration feedback switches pcal 563 for the positive side and ncal 564 for the negative side. Based on measured readings, digital calibration unit 560 can set the various switching elements Th1 514-Th3 516 and Pbit1 524-Pbit3 526 during a calibration or setup phase or in a monitoring phase as will be appreciated. In accordance with various embodiments, the calibration and threshold settings can be permanently set such as during a manufacturing set up, can be fixable, or can be permanently configurable or some combination thereof. For example, the calibration settings can be fixed, and the threshold settings can remain configurable or the like.

Figure 6:
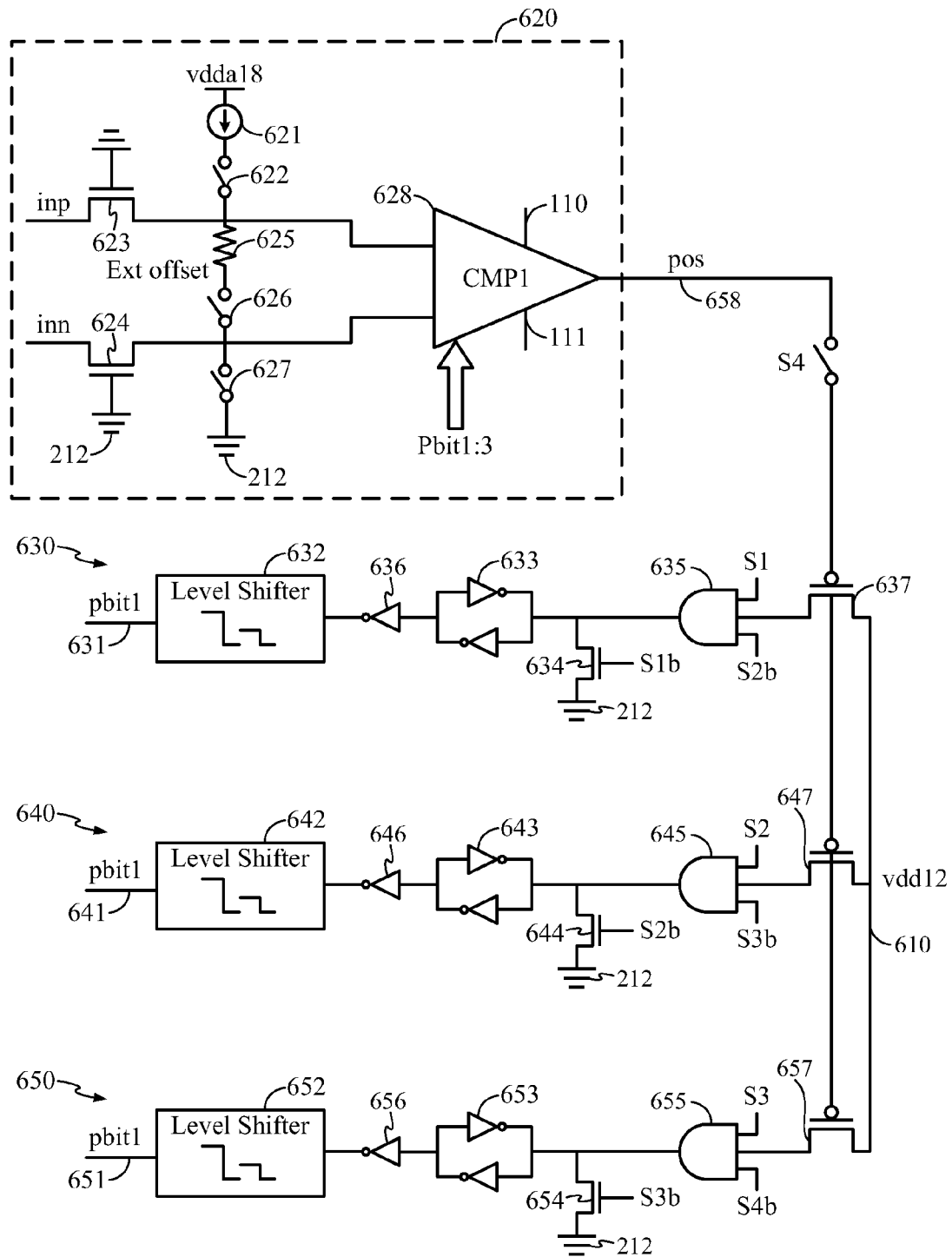
FIG. 6 is a diagram illustrating an exemplary timing circuit at a given calibration threshold setting.

In one embodiment, an exemplary calibration circuit as shown in FIG. 6, can be used, for example, to perform the calibration setting shown and described herein above, for example, in connection with digital calibration unit 560 of FIG. 5B. A circuit such as comparator calibration circuit 620, shown for illustrative purposes, for calibrating the positive signal side, can be coupled to pbit calibration sections 630, 640 and 650, which produce pbit outputs that are then fed back to the comparator calibration circuit 620. The calibration is a one time process which can be performed at the start or power-up of the chip and the calibrating settings can be stored for future use. In order to perform calibration, input inp 201 and inn 202 are blocked comparator 628, by switching element 623 and 624. A desired offset voltage is generated by dumping current through current source 621 into resistor 625 and applying the offset voltage as an input signal to the comparator CMP1 628. The comparator CMP1 628 then compares the external offset with the internal offset generated by the resistor network shown in FIG. 5A. If the external offset is greater than the internal offset, then output node 658 goes high. If external offset is less than the internal offset, then the output node 658 goes low.

Figure 7:
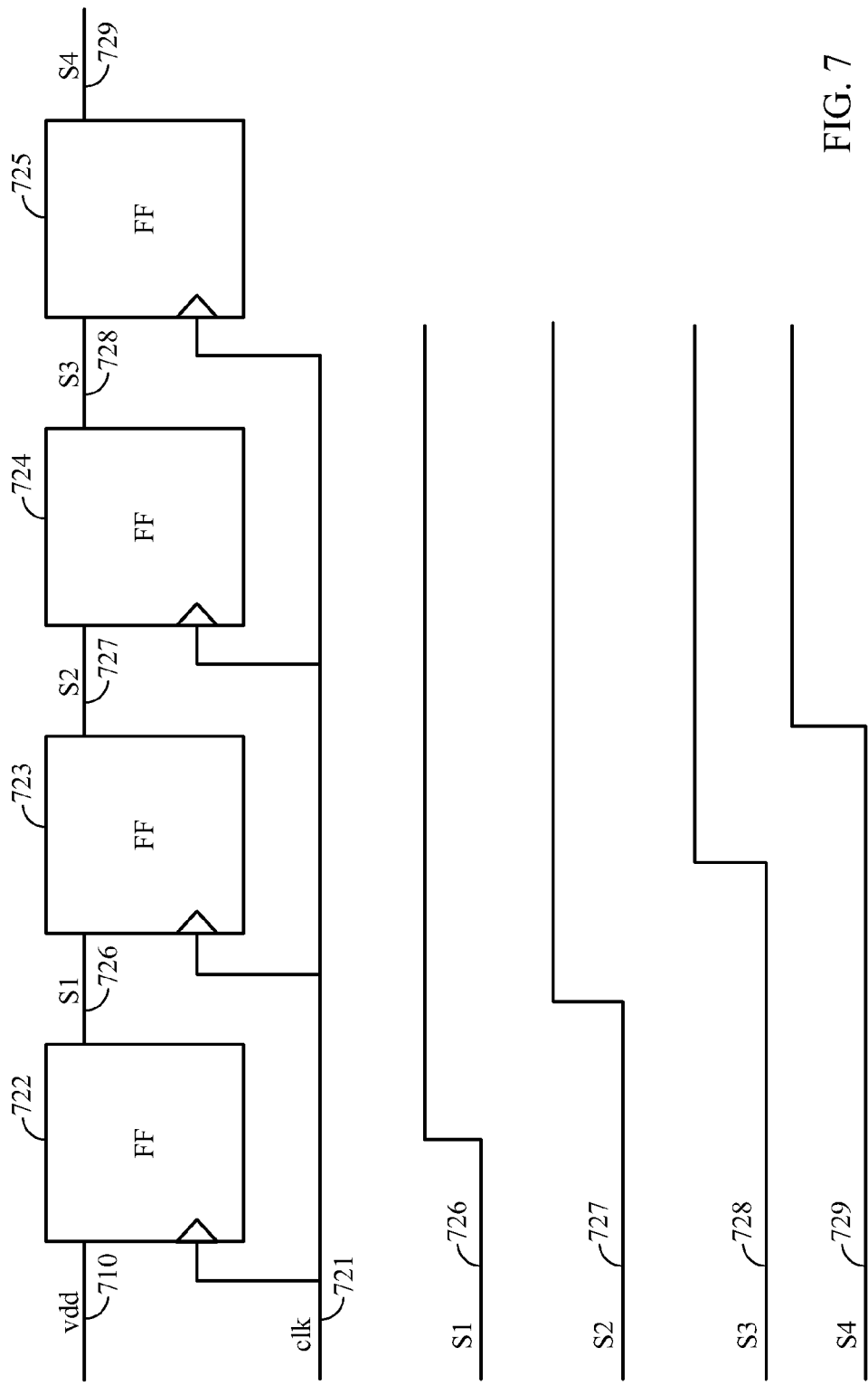
FIG. 7 is a timing diagram illustrating different signals in an exemplary timing circuit at a given calibration threshold setting.

The circuit generating calibration clocks is shown in FIG. 7 where four clock signals S1, S2, S3 and S4 are generated. The clocks S1$b$, S2$b$, S3$b$ and S4$b$ are inverted versions of the clocks S1, S2, S3 and S4. At the beginning of calibration all the pbits are driven to zero by pull down NMOS switches 634, 644 and 654 due to the initial state of S1$b$, S2$b$ and S3$b$ as all high. The output node 658 is driven to a low level turning ON PMOS switches 637, 647 and 657 which pre-charges middle input of all AND gates 635, 645 and 655 to high. At the next clock edge, S1 goes high while S2 and S3 are still zero as shown in FIG. 7. Pbit calibration section 630 is then activated and pbit1 goes high, thus reducing the internal offset of comparator CMP1 by turning ON parallel resistor branch as shown in FIG. 5A. If the output node 658 is still zero at next clock edge, section 640 of pbit calibration is activated such that the internal offset of comparator is reduced further. The sequence continues until pos or node 658 goes high at which point calibration is complete and the calibrated settings are latched by the latches 633, 643 and 653.

As discussed earlier, FIG. 7 shows an exemplary clock circuit 700 including flip flop elements 722-725. With a vdd signal coupled to the data input of the first element 722, a transition of clk 721 can produce a high level for S1 726 on the output of element 722, which can be coupled to the data input of element 723. The next transition of clk 721 will produce a high level for S2 727 on the output of element 723 which can be coupled to the data input of element 724. The next transition of clk 721 will produce a high level for S3 728 on the output of element 724, which can be coupled to the data input of element 725. The next transition of the clk 721 can produce a high level for S4 729 on the output of element 725 and so on, as shown by the timing relationships in the lower portion of FIG. 7. These signals can be input to FIG. 6 as noted above, for calibration purposes.

Figure 8:
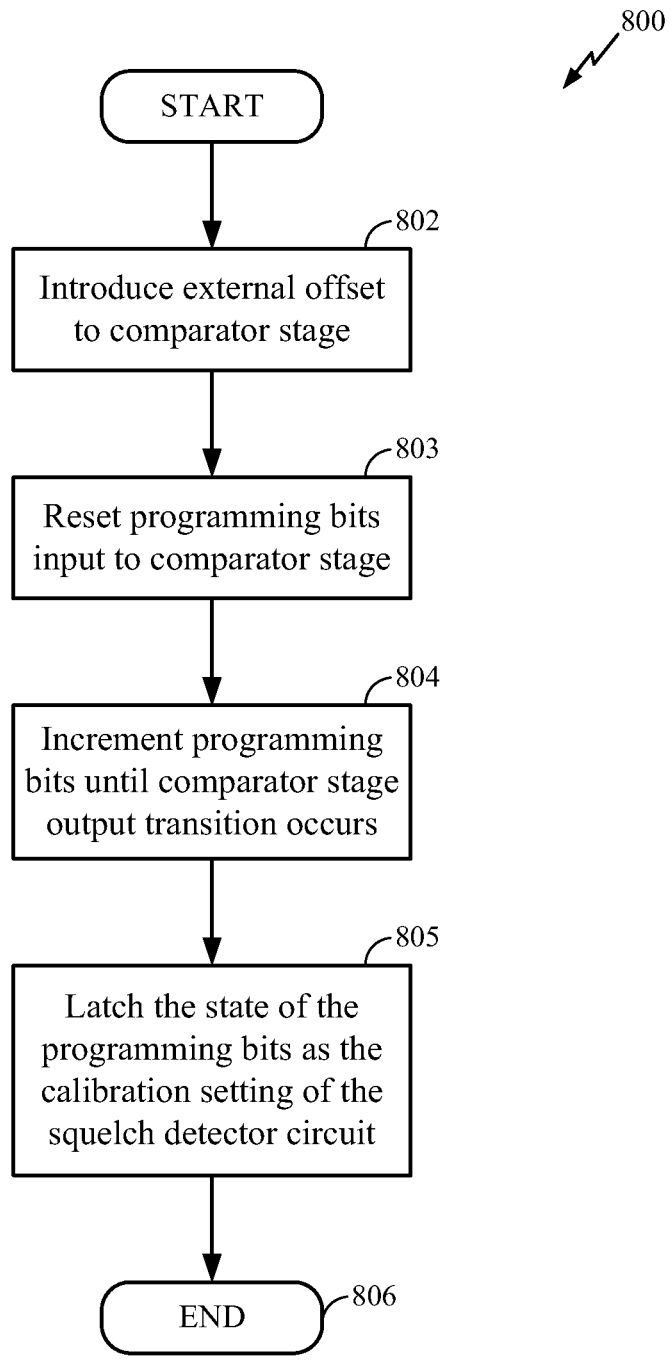
FIG. 8 is a flowchart illustrating an exemplary calibration procedure.

To the extent that the programmability of the calibration and the threshold level settings can be performed in a variety of manners consistent with embodiments described herein above and with other embodiments, an exemplary procedure for calibration is shown and described in connection with FIG. 8. It will be appreciated that the following description while referring to one side of a squelch detector circuit can be applicable to both comparator sides of, for example, a circuit that accommodates a differential input signal with a complimentary signal pair. After start at 801, which can represent the power up of the detector circuit or the like as would be understood by one of skill in the art, an external offset to the comparator stage at 802. A plurality of programming bits that are input to the comparator stage can be reset at 803. After the programming bits are reset, they are incremented until a transition in an output of the comparator stage occurs at 804. The programming bits can be incremented, for example, by turning on each of the plurality of programming bits in sequence. The transition represents a squelch detection threshold level associated with a difference between the internal offset and the external offset. Once the transition occurs, the levels, states or the like associated with each of the programming bits can be latched at 805 so as to store the calibration setting. While the procedure is indicated as ending at 806, it can be repeated whenever calibration is required and when different internal offsets are desired or required. While the procedure shown in FIG. 8 is described with various actions procedures or sub-procedures, embodiments are not limited solely to those described herein and particularly are not limited to the specific terms. It will be appreciated that the exemplary procedure can be embodied as a series of steps and associated functions as set forth in the claims appended hereto that can be performed using any suitable structures and procedures, for example, as described herein.

It should be noted that in an embodiment, the calibration of the squelch detector circuit can be performed during a calibration procedure during which signal inputs to the squelch detector circuit are prevented. The setting the internal offset includes switching a resistor in a resistor network coupled to the comparator stage. The incrementing the plurality of programming bits includes switching resistors in the resistor network with respective ones of the resistors corresponding to ones of the programming bits. More specifically, the setting the internal offset can include switching a first resistor in a first portion of the resistor network and incrementing the plurality of programming bits includes switching resistors in a second portion of the resistor network, with ones of the resistors corresponding to ones of the programming bits. Still further, in an embodiment, incrementing the plurality of programming bits can include switching a plurality switching elements coupled to a plurality of resistors in the resistor network. Ones of the plurality of switching elements are capable of being switched by corresponding ones of the plurality of programming bits.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor itself, can be a controller, a digital signal processor (DSP), a field-programmable gate array (FPGA), or the like.

It will be further appreciated that the squelch detector circuit as described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including the squelch detector as disclosed herein such as by being integrated into at least one semiconductor die associated with circuits in such devices.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A squelch detection circuit comprising:
a first comparator coupled to a complimentary input signal pair and having a first polarity output;
a second comparator coupled to the complimentary input signal pair and having a second polarity output, wherein an offset associated with the complimentary input signal pair, the first polarity output, and the second polarity output establishes a positive squelch threshold and a negative squelch threshold; and
a calibration unit coupled to the first comparator and the second comparator, the calibration unit generating a digital output including threshold settings and calibration settings to the first comparator and to the second comparator, the digital output associated with establishing the offset and with calibrating the positive squelch threshold and the negative squelch threshold, wherein the calibration unit includes a resistor network having a plurality of resistors switchably coupled in parallel, wherein a first subset of the plurality of resistors, when switchably coupled, form the threshold settings and a second subset of the plurality of resistors, when switchably coupled, form the calibration settings.

2. The squelch detection circuit according to claim 1, further comprising a logic circuit coupled to the first comparator and the second comparator, the logic circuit having inputs for the first polarity output and the second polarity output and an output for a squelch signal.

3. The squelch detection circuit according to claim 2, wherein the logic circuit includes a cross coupled latch.

4. The squelch detection circuit according to claim 1, wherein the first and the second comparator include a folded cascode circuit.

5. The squelch detection circuit according to claim 1, integrated in at least one semiconductor die.

6. The squelch detection circuit according to claim 1, wherein the squelch detector circuit is integrated into an electronic device, selected from the group consisting of a set top box, music player, video player, entertainment unit, navigation device, communications device, personal digital assistant (PDA), fixed location data unit, and a computer.

7. A squelch detection circuit comprising:
a first comparator coupled to a complimentary input signal pair and having a first polarity output;
a second comparator coupled to the complimentary input signal pair and having a second polarity output, wherein an offset associated with the complimentary input signal pair, the first polarity output, and the second polarity output establishes a positive squelch threshold and a negative squelch threshold; and
a calibration unit coupled to the first comparator and the second comparator, the calibration unit generating a digital output including threshold settings and calibration settings to the first comparator and to the second comparator, the digital output associated with establishing the offset and with calibrating the positive squelch threshold and the negative squelch threshold, wherein the calibration unit includes:
a first source follower circuit coupled to the complimentary input signal pair and to the first comparator, wherein the first source follower circuit includes a first offset balancing circuit; and
a second source follower circuit coupled to the complimentary input signal pair and to the second comparator, wherein the second source follower circuit includes a second offset balancing circuit.

8. The squelch detection circuit according to claim 7, wherein the first offset balancing circuit and the second offset balancing circuit each comprise a resistive element.

9. The squelch detection circuit according to claim 7, wherein one or more of the first offset balancing circuit or the second offset balancing circuit include a resistor network having a plurality of resistors switchably coupled in parallel, first ones of the plurality of resistors, when switchably coupled, forming the threshold settings and second ones of the plurality of resistors, when switchably coupled, forming the calibration settings.

10. The squelch detection circuit according to claim 4, wherein:
the first offset balancing circuit includes a first resistor network coupled to a first input element associated with a first input of the complimentary input signal pair in the first source follower circuit,
the second offset balancing circuit includes a second resistor network coupled to a second input element associated with a second input of the complimentary input signal pair in the second source follower circuit, and
the first resistor network and the second resistor network each have a plurality of resistors switchably coupled in parallel, first ones of the plurality of resistors, when switchably coupled, forming the threshold settings and second ones of the plurality of resistors, when switchably coupled, forming the calibration settings.

11. The squelch detection circuit according to claim 7, wherein the first source follower circuit includes the first offset balancing circuit in a positive signal input path to the first comparator and the second source follower circuit includes the second offset balancing circuit in a negative input signal path to the second comparator.

12. A squelch detection circuit comprising:
a first comparator coupled to a complimentary input signal pair and having a first polarity output;
a second comparator coupled to the complimentary input signal pair and having a second polarity output, wherein an offset associated with the complimentary input signal pair, the first polarity output, and the second polarity output establishes a positive squelch threshold and a negative squelch threshold; and a calibration unit coupled to the first comparator and the second comparator, the calibration unit generating a digital output including threshold settings and calibration settings to the first comparator and to the second comparator, the digital output associated with establishing the offset and with calibrating the positive squelch threshold and the negative squelch threshold, wherein the calibration unit includes a resistor network having a plurality of resistors switchably coupled in parallel in an input portion of each of the first and second comparators, the input portion including a constant current source, first ones of the plurality of resistors, when switchably coupled, forming the threshold settings and first of second ones of the plurality of resistors, when switchably coupled, forming the calibration settings for the first comparator and second of the second ones of the plurality of resistors, when switchably coupled, forming the calibration settings for the second comparator.

13. A squelch detector comprising:

first comparator means for providing a first polarity output when an offset associated with a complimentary input signal pair exceeds a first squelch threshold;

second comparator means for providing a second polarity output when the offset associated with the complimentary input signal pair exceeds a second threshold; and calibration means coupled to the first comparator means and the second comparator means, the calibration means for generating a digital output including threshold settings and calibration settings to the first comparator means and to the second comparator means, the digital output for establishing the offset and calibrating the positive squelch threshold and the negative squelch threshold, wherein the calibration means includes resistive means and switch means for switchably coupling in parallel, first ones of a plurality of resistors associated with the resistive means that, when switchably coupled, form the threshold settings and second ones of the plurality of resistors that, when switchably coupled, form the calibration settings.

14. The squelch detector according to claim 12, further comprising logic means for generating a squelch-related output signal.

15. The squelch detector according to claim 14, further comprising latching means for avoiding metastability associated with the squelch-related output signal.

16. The squelch detector according to claim 13, wherein the calibration means includes the resistive means and the switch means in a positive signal input path to the first comparator means and a negative signal input path to the second comparator means, the positive signal input and the negative input signal path including a constant current source.

17. The squelch detector according to claim 13, wherein the first and the second comparator means include a folded cascode circuit.

18. The squelch detector according to claim 13, integrated in at least one semiconductor die.

19. The squelch detector according to claim 13, wherein the squelch detector is integrated into an electronic device, selected from the group consisting of a set top box, music player, video player, entertainment unit, navigation device, communications device, personal digital assistant (PDA), fixed location data unit, and a computer.

20. A calibration circuit for a squelch detector, comprising:

a programmable resistor network coupled to a comparator circuit in the squelch detector, the programmable resistor network including a plurality of resistors switchably coupled in parallel, wherein a first portion of the plurality of resistors are for establishing a squelch detection threshold setting for the comparator circuit and a second portion of the plurality of resistors are for establishing a calibration setting for calibrating a mismatch between a first input and a second input of the comparator circuit; and a switching network coupled to the programmable resistor network, the switching network including a plurality of switching elements coupled to the plurality of resistors, wherein a first portion of the plurality of switching elements coupled to the first portion of the plurality of resistors and a second portion of the plurality of switching elements are coupled to the second portion of the plurality of resistors, wherein programming signals are coupled to the switching network, the programming signals switchably coupling ones of the first portion of the plurality of resistors through corresponding ones of the first portion of the switching elements to establish the squelch detection threshold setting and switchably coupling ones of the second portion of the plurality of resistors through corresponding ones of the second portion of the plurality of switching elements to establish the calibration setting.

21. The calibration circuit according to claim 20, integrated into at least one semiconductor die.

22. The calibration circuit according to claim 20, wherein the calibration circuit is integrated into an electronic device, selected from the group consisting of a set top box, music player, video player, entertainment unit, navigation device, communications device, personal digital assistant (PDA), fixed location data unit, and a computer.

23. The calibration circuit according to claim 20, further comprising:

a first source follower circuit coupled to a first comparator of the comparator circuit and to a complimentary input signal pair input to the comparator circuit, wherein the first source follower circuit includes a first offset balancing circuit; and a second source follower circuit coupled to a second comparator of the comparator circuit and to the complimentary input signal pair input to the comparator circuit, wherein the second source follower circuit includes a second offset balancing circuit.

24. The calibration circuit according to claim 20, wherein the programmable resistor network and the switching network are included in an input portion of the comparator circuit that has a constant current source.

25. A method for calibrating a squelch detector circuit comprising:

setting an internal offset in a comparator stage of the squelch detector circuit;

introducing an external offset to the comparator stage;

resetting a plurality of programming bits input to the comparator stage; and incrementing the plurality of programming bits until a transition in an output of the comparator stage occurs, the transition representing a squelch detection threshold level associated with a difference between the internal offset and the external offset.

26. The method according to claim 25, further comprising latching a state of the plurality of programming bits as a calibration setting for the squelch detector circuit.

27. The method according to claim 25, wherein the incrementing the plurality of programming bits includes turning on each of the plurality of programming bits in sequence.

28. The method according to claim 25, wherein the incrementing the plurality of programming bits is performed during a calibration procedure during which signal inputs to the squelch detector circuit are prevented.

29. The method according to claim 25, wherein the setting the internal offset includes switching a resistor in a resistor network coupled to the comparator stage.

30. The method according to claim 25, wherein the incrementing the plurality of programming bits includes switching resistors in a resistor network coupled to the comparator stage, ones of the resistors corresponding to ones of the programming bits.

31. The method according to claim 25, wherein the setting the internal offset includes switching a first resistor in a first portion of a resistor network coupled to the comparator stage and wherein the incrementing the plurality of programming bits includes switching resistors in a second portion of the resistor network, ones of the resistors corresponding to ones of the programming bits.

32. The method according to claim 22, wherein the incrementing the plurality of programming bits includes switching a plurality switching elements coupled to a plurality of resistors in a resistor network, ones of the plurality of switching elements capable of being switched by corresponding ones of the plurality of programming bits.

33. The method according to claim 25, further comprising a step for establishing the squelch detection threshold level and a calibration setting for the squelch detector circuit in response to the transition in the output of the comparator stage, wherein a calibration unit switchably couples a first plurality of resistors in a resistor network to establish the squelch detection threshold level and switchably couples a second plurality of resistors in the resistor network to establish the calibration setting.

34. A method for calibrating a squelch detector circuit comprising:
    a step for setting an internal offset in a comparator stage of the squelch detector circuit;
    a step for introducing an external offset to the comparator stage;
    a step for resetting a plurality of programming bits input to the comparator stage; and
    a step for incrementing the plurality of programming bits until a transition in an output of the comparator stage occurs, the transition representing a squelch detection threshold level associated with a difference between the internal offset and the external offset.

35. The method according to claim 34, further comprising a step for latching a state of the plurality of programming bits as a calibration setting for the squelch detector circuit.

36. The method according to claim 34, wherein the step for incrementing the plurality of programming bits includes a step for turning on each of the plurality of programming bits in sequence.

37. The method according to claim 34, wherein the step for incrementing the plurality of programming bits is performed during a calibration procedure during which signal inputs to the squelch detector circuit are prevented.

38. The method according to claim 34, wherein the step for setting the internal offset includes a step for switching a resistor in a resistor network coupled to the comparator stage.

39. The method according to claim 34, wherein the step for incrementing the plurality of programming bits includes a step for switching resistors in a resistor network coupled to the comparator stage, ones of the resistors corresponding to ones of the programming bits.

40. The method according to claim 34, wherein the step for setting the internal offset includes a step for switching a first resistor in a first portion of a resistor network coupled to the comparator stage and wherein the step for incrementing the plurality of programming bits includes a step for switching resistors in a second portion of the resistor network, ones of the resistors corresponding to ones of the programming bits.

41. The method according to claim 34, wherein the step for incrementing the plurality of programming bits includes a step for switching a plurality switching elements coupled to a plurality of resistors in a resistor network, ones of the plurality of switching elements capable of being switched by corresponding ones of the plurality of programming bits.

42. The method according to claim 34, further comprising a step for establishing the squelch detection threshold level and a calibration setting for the squelch detector circuit in response to the transition in the output of the comparator stage, wherein a calibration unit switchably couples a first plurality of resistors in a resistor network to establish the squelch detection threshold level and switchably couples a second plurality of resistors in the resistor network to establish the calibration setting.

43. An apparatus for calibrating a squelch detector circuit, comprising:
    at least one processor configured to set an internal offset in a comparator stage of the squelch detector circuit, introduce an external offset to the comparator stage, reset a plurality of programming bits input to the comparator stage, and increment the plurality of programming bits until a transition in an output of the comparator stage occurs, wherein the transition represents a squelch detection threshold level associated with a difference between the internal offset and the external offset; and
    a memory coupled to the at least one processor.

44. An apparatus for calibrating a squelch detector circuit, comprising:
    means for setting an internal offset in a comparator stage of the squelch detector circuit;
    means for introducing an external offset to the comparator stage;
    means for resetting a plurality of programming bits input to the comparator stage; and
    means for incrementing the plurality of programming bits until a transition in an output of the comparator stage occurs, wherein the transition represents a squelch detection threshold level associated with a difference between the internal offset and the external offset.

45. A computer-readable storage medium having computer-executable instructions for calibrating a squelch detector circuit stored thereon, wherein executing the computer-executable instructions on a processor causes the processor to:
    set an internal offset in a comparator stage of the squelch detector circuit;
    introduce an external offset to the comparator stage;
    reset a plurality of programming bits input to the comparator stage; and
    increment the plurality of programming bits until a transition in an output of the comparator stage occurs, wherein the transition represents a squelch detection threshold level associated with a difference between the internal offset and the external offset.

46. A squelch detector comprising:
    first comparator means for providing a first polarity output when an offset associated with a complimentary input signal pair exceeds a first squelch threshold;

second comparator means for providing a second polarity output when the offset associated with the complimentary input signal pair exceeds a second threshold; and calibration means coupled to the first comparator means and the second comparator means, the calibration means for generating a digital output including threshold settings and calibration settings to the first comparator means and to the second comparator means, the digital output for establishing the offset and calibrating the positive squelch threshold and the negative squelch threshold, wherein the calibration means includes:

first source follower means coupled to the complimentary input signal pair and to the first comparator means, the first source follower means for establishing the offset in a positive signal input path to the first comparator means; and second source follower means coupled to the complimentary input signal pair and to the second comparator means, the second source follower means for establishing the offset in a negative signal input path to the second comparator means.

* * * * *